(12) United States Patent
Cox et al.

(10) Patent No.: US 9,230,780 B2
(45) Date of Patent: Jan. 5, 2016

(54) HALL EFFECT ENHANCED CAPACITIVELY COUPLED PLASMA SOURCE

(71) Applicant: Applied Materials, Inc., Santa Clara, CA (US)

(72) Inventors: Michael S. Cox, Gilroy, CA (US); Rongping Wang, Cupertino, CA (US); Brian T. West, San Jose, CA (US); Roger M. Johnson, Livermore, CA (US); Colin John Dickinson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/199,974

(22) Filed: Mar. 6, 2014

(65) Prior Publication Data
US 2015/0255251 A1 Sep. 10, 2015

(51) Int. Cl.
*C23C 16/54* (2006.01)
*H01J 37/32* (2006.01)
*H01J 37/16* (2006.01)

(52) U.S. Cl.
CPC .......... *H01J 37/3266* (2013.01); *H01J 37/165* (2013.01); *H01J 37/321* (2013.01); *H01J 37/32596* (2013.01); *H01J 2237/002* (2013.01); *H01J 2237/327* (2013.01)

(58) Field of Classification Search
CPC ................. B01J 2219/0852; B01J 2219/0894; H01J 37/32091; H01J 37/32192; H01J 37/3267
USPC .......................................................... 313/32
See application file for complete search history.

(56) References Cited

U.S. PATENT DOCUMENTS

| | | | |
|---|---|---|---|
| 5,453,125 A | 9/1995 | Krogh | |
| 6,156,667 A | 12/2000 | Jewett | |
| 6,291,938 B1 | 9/2001 | Jewett et al. | |
| 6,888,040 B1 | 5/2005 | Shufflebotham et al. | |
| 8,742,665 B2 | 6/2014 | Lubomirsky et al. | |
| 8,747,762 B2 | 6/2014 | Dickinson et al. | |
| 8,771,538 B2 | 7/2014 | Lubomirsky et al. | |
| 2009/0183684 A1 | 7/2009 | Radoiu | |
| 2012/0279657 A1 | 11/2012 | Srivastava et al. | |
| 2013/0082197 A1 | 4/2013 | Yang et al. | |
| 2013/0284724 A1 | 10/2013 | Cox et al. | |
| 2014/0262033 A1 | 9/2014 | Herbert et al. | |
| 2014/0291139 A1 | 10/2014 | Dickinson et al. | |

OTHER PUBLICATIONS

U.S. Appl. No. 62/007,513 in the name of Colin John Dickinson entitled Reagent Delivery System Freeze Prevention Heat Exchanger; filed Jun. 4, 2014; 18 total pages.
U.S. Appl. No. 14/445,965 in the name of Jibing Zeng, et al.; entitled Apparatus for Treating a Gas in a Conduit; filed Jul. 29, 2014; 18 total pages.
PCT Notification of Transmittal of the International Search Report and the Written Opinion of the International Searching Authority for International Application No. PCT/US2015/015054 dated May 15, 2015; 9 total pages.

*Primary Examiner* — Tracie Y Green
(74) *Attorney, Agent, or Firm* — Patterson & Sheridan, L.L.P.

(57) ABSTRACT

Embodiments disclosed herein include a plasma source for abating compounds produced in semiconductor processes. The plasma source has a first plate and a second plate parallel to the first plate. An electrode is disposed between the first and second plates and an outer wall is disposed between the first and second plates surrounding the cylindrical electrode. The plasma source has a first plurality of magnets disposed on the first plate and a second plurality of magnets disposed on the second plate. The magnetic field created by the first and second plurality of magnets is substantially perpendicular to the electric field created between the electrode and the outer wall. In this configuration, a dense plasma is created.

20 Claims, 5 Drawing Sheets

HALL EFFECT ENHANCED CAPACITIVELY COUPLED PLASMA SOURCE

BACKGROUND

1. Field

Embodiments of the present disclosure generally relate to semiconductor processing equipment. More particularly, embodiments of the present disclosure relate to a plasma source for abating compounds produced in semiconductor processes.

2. Description of the Related Art

The process gases used by semiconductor processing facilities include many compounds which must be abated or treated before disposal, due to regulatory requirements and environmental and safety concerns. Among these compounds are perfluorocarbons (PFCs), which are used, for example, in etching processes. Inductively coupled plasma (ICP) source has been used for abatement of PFCs and global warming gases. The plasma generated by the ICP plasma source dissociates these compounds, and the dissociated gases react to form less hazardous materials. However, current abatement technology is unable to abate certain types of gases and particulate matter used and generated in deposition processes, such as insulating or conducting materials generated therefrom. Such insulating or conducting materials may coat the inside surface of the ICP source, shielding out the changing magnetic field from the RF coil, and in turn causing the ICP source to stop functioning.

Accordingly, what is needed in the art is an improved plasma source for abating compounds produced in semiconductor processes.

SUMMARY

Embodiments disclosed herein include a plasma source for abating compounds produced in semiconductor processes. The plasma source has a first plate and a second plate parallel to the first plate. An electrode is disposed between the first and second plates and an outer wall is disposed between the first and second plates surrounding the cylindrical electrode. The plasma source has a first plurality of magnets disposed on the first plate and a second plurality of magnets disposed on the second plate. The magnetic field created by the first and second plurality of magnets is substantially perpendicular to the electric field created between the electrode and the outer wall. In this configuration, a dense plasma is created.

In one embodiment, a plasma source is disclosed. The plasma source includes a first plate having an outer edge and an inner edge, a second plate parallel to the first plate, where the second plate has an outer edge and an inner edge, an outer wall disposed between the outer edges of the first and second plates, an electrode disposed between the inner edges of the first and second plates, a first plurality of magnets disposed on the first plate and a plurality and a second plurality of magnets disposed on the second plate.

In another embodiment, a plasma source is disclosed. The plasma source includes a cylindrical electrode having a first end and a second end, an outer cylindrical wall surrounding the cylindrical electrode, where the outer cylindrical wall has a first end and a second end, a first annular plate having an inner edge and an outer edge, where the inner edge is in proximity to the first end of the cylindrical electrode and the outer edge is adjacent to the first end of the outer cylindrical wall, a second annular plate having an inner edge and an outer edge, where the inner edge is in proximity to the second end of the cylindrical electrode and the outer edge is adjacent to the second end of the outer cylindrical wall, and where a plasma region is defined by the cylindrical electrode, the outer cylindrical wall, the first annular plate and the second annular plate. The plasma source further includes a first plurality of magnets disposed on the first annular plate and a second plurality of magnets disposed on the second annular plate.

In another embodiment, a plasma source is disclosed. The plasma source includes a first annular plate having an outer edge and an inner edge, a second annular plate parallel to the first annular plate, where the second annular plate has an outer edge and an inner edge, and wherein the first annular plate has a surface facing the second annular plate and the second annular plate has a surface facing the first annular plate. The plasma source further includes an outer cylindrical wall disposed between the outer edges of the first and second annular plates, an cylindrical electrode disposed between the inner edges of the first and second annular plates, a first shield disposed adjacent to the surface of the first annular plate, and a second shield disposed adjacent to the surface of the second annular plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
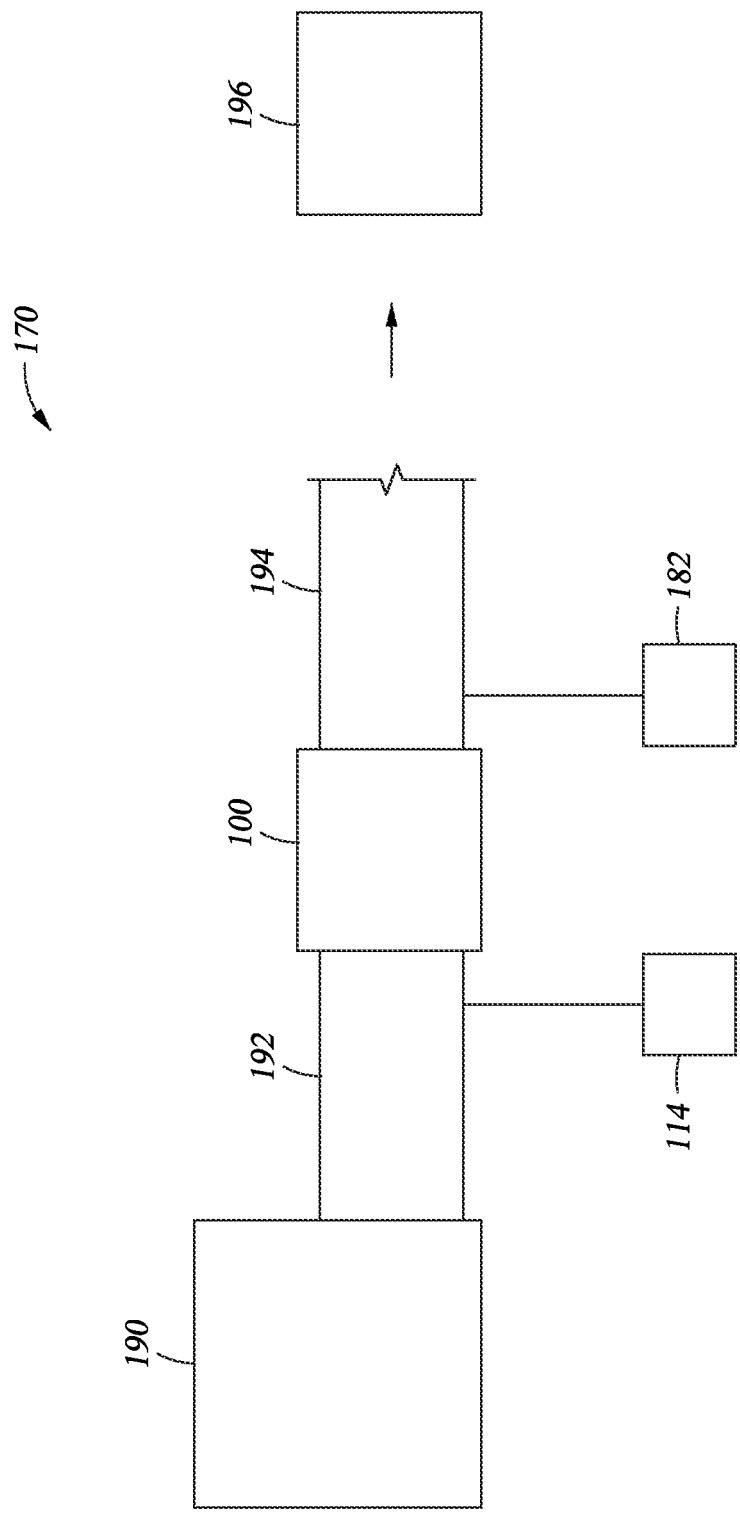
FIG. 1A is a schematic side view of a vacuum processing system having a plasma source according to one embodiment.

FIG. 1A is a schematic side view of a vacuum processing system 170 having a plasma source 100 according to one embodiment. The vacuum processing system 170 includes a vacuum processing chamber 190. The vacuum processing chamber 190 is generally configured to perform at least one integrated circuit manufacturing process, such as a deposition process, an etch process, a plasma treatment process, a pre-clean process, an ion implant process, or other integrated circuit manufacturing process. The process performed in the vacuum processing chamber 190 may be plasma assisted. For example, the process performed in the vacuum processing chamber 190 may be plasma deposition process for depositing a silicon-based material.

The vacuum processing chamber 190 has a chamber exhaust coupled by a foreline 192 to the plasma source 100. The exhaust of the plasma source 100 is coupled by an exhaust conduit 194 to pumps and facility exhaust, schematically indicated by a single reference numeral 196 in FIG. 1A. The pumps are generally utilized to evacuate the vacuum processing chamber 190, while the facility exhaust generally includes scrubbers or other exhaust cleaning apparatus for preparing the effluent of the vacuum processing chamber 190 to enter the atmosphere.

The plasma source 100 is utilized to perform an abatement process on gases and/or other materials exiting the vacuum processing chamber 190 so that such gases and/or other materials may be converted into a more environmentally and/or process equipment friendly composition. Details of the plasma source 100 are further described below.

In some embodiment, an abating reagent source 114 is couple to at least one of the foreline 192 and gases and/or the plasma source 100. The abating reagent source 114 provides an abatement reagent into the plasma source 100 which may be energized to react with or otherwise assist converting the materials to be exiting the vacuum processing chamber 190 into a more environmentally and/or process equipment friendly composition.

Optionally, a pressure regulating module 182 may be coupled to at least one of the plasma source 100 or exhaust conduit 194. The pressure regulating module 182 injects a pressure regulating gas, such as Ar, N, or other suitable gas which allows the pressure within the plasma source 100 to be better controlled, and thereby provide more efficient abatement performance.

Figure 1B:
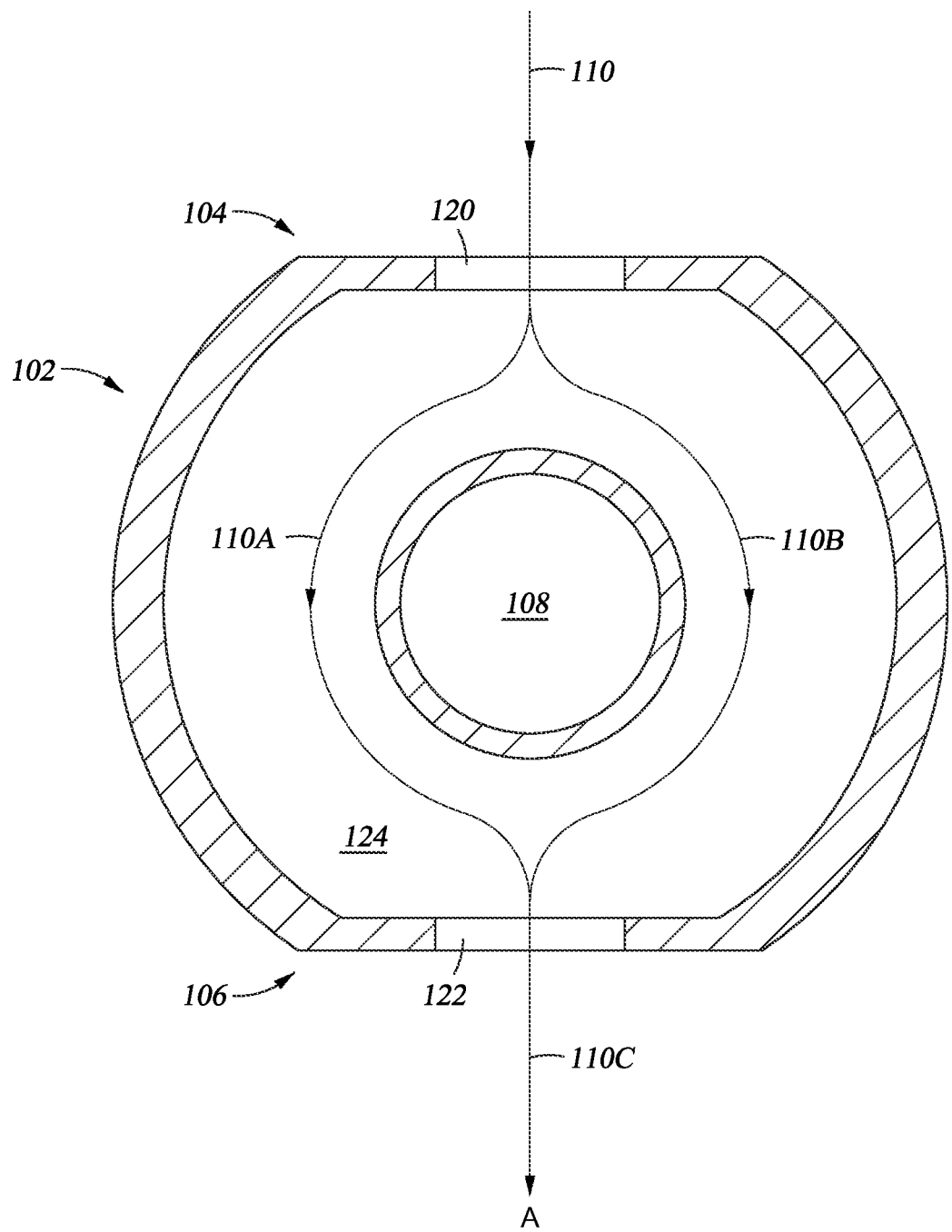
FIG. 1B is a sectional view of the plasma source of FIG. 1A.

FIG. 1B is a side view of the plasma source 100 according to one embodiment. The plasma source 100 may be disposed downstream of the vacuum processing chamber 190. The plasma generated in the plasma source 100 energizes and/or dissociates, partially or fully, the compounds within the effluent coming out of the vacuum processing chamber 190, converting the compounds in the effluent into more benign form. In one embodiment, due to the ability of producing dense plasma, the plasma source 100 may act as a remote plasma source that is disposed upstream of the processing chamber to deliver products of plasma, such as molecular or atomic species, a dense plasma into the processing chamber.

The plasma source 100 may include a body 102 having a first end 104 and a second end 106. The first end 104 may be parallel to the second end 106. The first end 104 may have an opening 120 configured to couple to the foreline 192 and the second end 106 may have an opening 122 configured to coupled to the exhaust conduit 194. The body 102 may be circular, square, rectangular, or in other suitable shape. In one embodiment, the body 102 has a racetrack shape. An opening 108 may be formed through the body 102. The opening 108 may be circular, square, rectangular, or in other suitable shape. In one embodiment, the body 102 is annular. In other embodiments, the body 102 does not include the opening 108.

A gas mixture 110, such as the by-products in the effluent exiting the vacuum processing chamber 190 or in the example where the plasma source 100 is a remote plasma source, as precursor and/or carrier gases for generating a remote plasma, may enter the plasma source 100 through the opening 120 at the first end 104. The gas mixture 110 may be dissociated by a plasma formed in the plasma region 124 and treated by abating agents, and exiting as a less hazardous material through the opening 122 at the second end 106. The gas mixture 110 may split into two streams 110A and 110B by the opening 108 and then combine to stream 110C when exiting the body 102, indicated by path "A" shown in FIG. 1B. If the gas mixture 110 is the by-products in the effluent exiting the vacuum processing chamber, one or more abating agents may be introduced into the plasma source 100 from the abating reagent source 114 shown in FIG. 1A. The by-products in the effluent may include silicon, tungsten, titanium, or aluminum containing materials. Examples of silicon-containing materials present in the effluent that may be abated using the plasma source 100 disclosed herein include, for example, silicon oxide (SiO), silicon dioxide ($SiO_2$), silane ($SiH_4$), disilane, silicon tetrachloride ($SiCl_4$), silicon nitride ($SiN_x$), dichlorosilane ($SiH_2Cl_2$), hexachlorodisilane ($Si_2Cl_6$), bis(t-butyl amino)silane, trisilylamine, disilylmethane, trisilylmethane, tetrasilylmethane, tetraethyl orthosilicate (TEOS) ($Si(OEt)_4$), disiloxanes, such as disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane (—$SiH_2OSiH_2OSiH_2O$—). Examples of tungsten-containing materials present in the effluent that may be abated using the methods disclosed herein include, for example, $W(CO)_6$, $WF_6$, $WCl_6$, or $WBr_6$. Examples of titanium-containing materials present in the effluent that may be abated using the methods disclosed herein include, for example, $TiCl_4$ and $TiBr_4$. Examples of aluminum-containing materials present in the effluent that may be abated using the methods disclosed herein include, for example, trimethyl aluminum.

The abating agent may include, for example, $CH_4$, $H_2O$, $H_2$, $NF_3$, $SF_6$, $F_2$, HCl, HF, $Cl_2$, HBr, $H_2$, $H_2O$, $O_2$, $N_2$, $O_3$, CO, $CO_2$, $NH_3$, $N_2O$, $CH_4$, and combinations thereof. The abating agent may also include a combination of $CH_xF_y$ and $O_2$ and/or $H_2O$, and a combination of $CF_x$ and $O_2$ and/or $H_2O$. Different abating agent may be used for effluent having different compositions.

Figure 2A:
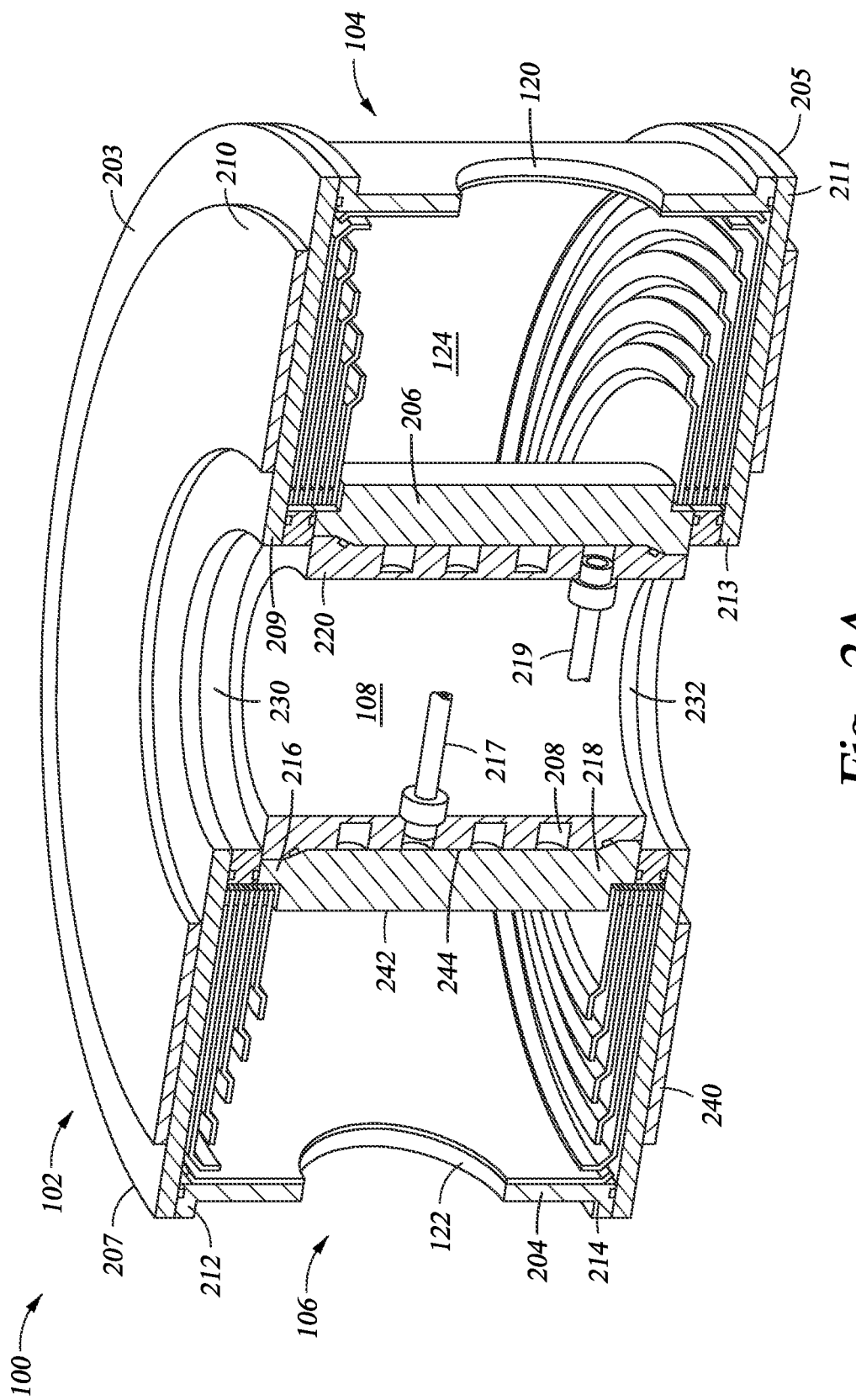
FIG. 2A is a cross sectional perspective view of the plasma source according to one embodiment.

FIG. 2A is a cross sectional perspective view of the plasma source 100 according to one embodiment. As shown in FIG. 2A, the body 102 may include an outer wall 204, an inner wall 206, a first plate 203 and a second plate 205. The first plate 203 and the second plate 205 may have a ring shape and the outer and inner walls 204, 206 may be cylindrical. The inner wall 206 may be a hollow electrode which may be coupled to an RF source (not shown). The outer wall 204 may be grounded. The first plate 203 and the second plate 205 may be concentric with the inner wall 206. The first plate 203 may have an outer edge 207 and an inner edge 209 and the second plate 205 may have an outer edge 211 and an inner edge 213. The outer wall 204 may have a first end 212 and a second end 214, and the inner wall 206 may have a first end 216 and a second end 218. A first insulating ring 230 may be disposed adjacent to the first end 216 of the inner wall 206 and a second insulating ring 232 may be disposed adjacent to the second end 218 of the inner wall 206. The insulating rings 230, 232 may be made of an insulating ceramic material. The outer edge 207 of the first plate 203 may be adjacent to the first end 212 of the outer wall 204 and the outer edge 211 of the second plate 205 may be adjacent to the second end 214 of the outer wall 204. In one embodiment, the ends 212, 214 of the outer wall 204 are in contact with the outer edges 207, 211, respectively. The inner edge 209 of the first plate 203 may be adjacent to the first insulating ring 230 and the inner edge 213 of the second plate 205 may be adjacent to the second insulating ring 232. The plasma region 124 is defined between the outer wall 204 and the inner wall 206 and between the first plate 203 and the second plate 205, and a capacitively coupled plasma may be formed in the plasma region 124.

Figure 2B:
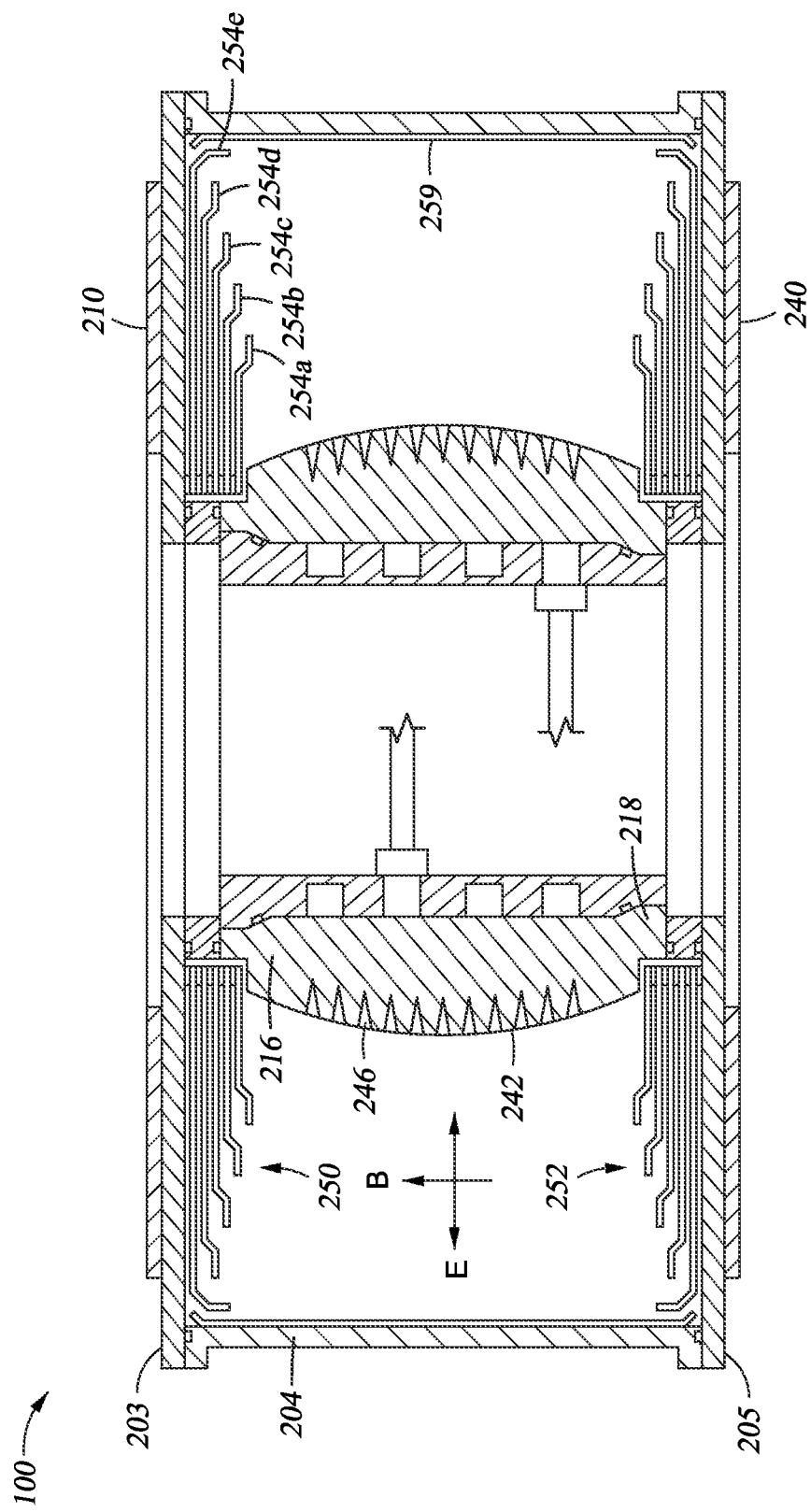
FIG. 2B is a cross sectional bottom view of the plasma source according to one embodiment.

In order to keep the inner wall 206 cool during operation, a cooling jacket 220 may be coupled to the inner wall 206. The inner wall 206 may have a first surface 242 facing the outer wall 204 and a second surface 244 opposite the first surface. In one embodiment, both surfaces 242, 244 are linear and the cooling jacket 220 is coupled to the second surface 244. In one embodiment, the first surface 242 is curved and the second surface 244 is linear, as shown in FIG. 2B. The cooling jacket 220 may have a cooling channel 208 formed therein, and the cooling channel 208 is coupled to a coolant inlet 217 and a coolant outlet 219 for flowing a coolant, such as water, into and out of the cooling jacket 220. A first plurality of magnets 210 may be disposed on the first plate 203. In one embodiment, the first plurality of magnets 210 may be a magnetron having an array of magnets and may have an annular shape. A second plurality of magnets 240 may be disposed on the second plate 205, and the second plurality of magnets 240 may be a magnetron having an array of magnets and may have the same shape as the first plurality of magnets 210. In one embodiment, the second plurality of magnets 240 is a magnetron and has an annular shape. In one embodiment, the magnets 210, 240 are linear arrays formed near the ends 104, 106. The magnets 210, 240 may have opposite polarity facing the plasma region 124. The magnets 210, 240 may be rare-earth magnets, such as neodymium ceramic magnets.

FIG. 2B is a cross sectional bottom view of the plasma source 100 according to one embodiment. As shown in FIG. 2B, the first surface 242 of the inner wall 206 has a plurality of groves 246 disposed thereon. The groves 246 may be a continuous trench. Even though the first surface 242 shown in FIG. 2B is curved, the groves 246 may be formed on the linear first surface 242, as shown in FIG. 2A. During operation, the inner wall 206 is powered by a radio frequency (RF) power source and the outer wall 204 is grounded, forming an oscillating or constant electric field "E" in the plasma region 124, depending on the type of applied power, RF or direct current (DC), or some frequency in between. Bi-polar DC and bi-polar pulsing DC power may also be used with inner and outer walls forming the two opposing electrical poles. The magnets 210, 240 create a largely uniform magnetic field "B" that is substantially perpendicular to the electric field "E." In this configuration, a resulting force causes the current that would normally follow the electric field "E" to curve towards the end 106 (out of the paper), and this force raises the plasma density significantly by limiting plasma electron losses to the grounded wall. In the case of applied RF power, this would result in an annular oscillating current directed largely away from the grounded wall. In the case of applied DC power, this would result in a constant annular current directed largely away from the grounded wall. This effect of current divergence from the applied electric field is known as the "Hall effect." The plasma formed in the plasma region 124 dissociates at least a portion of the by-products in the effluent flowing in from the opening 120 at the first end 104. Abating agent may be also injected to react with the dissociated and forming less hazardous compounds. In one embodiment, the effluent contains silane, and the abating agent may be water or oxygen, which turns silane in the effluent into glass.

Figure 2C:
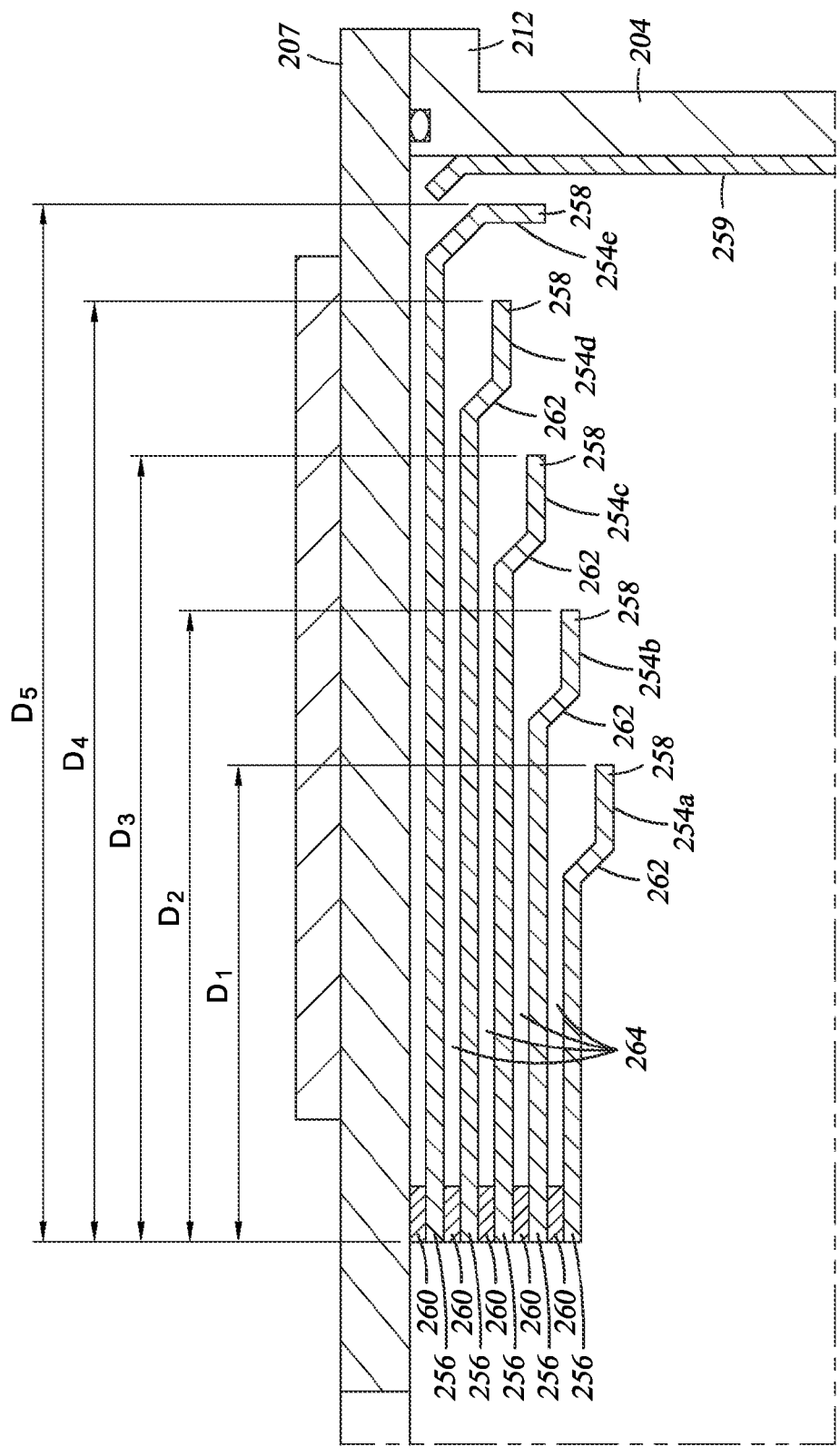
FIG. 2C is an enlarged view of a metal shield according to one embodiment.

A first metal shield 250 may be disposed inside the plasma region 124 adjacent to the first plate 203, a second metal shield 252 may be disposed inside the plasma region 124 adjacent to the second plate 205, and a third metal shield 259 may be disposed in the plasma region adjacent to the outer wall 204. Shields 250, 252, 259 may be removable, replaceable and/or reusable since materials may be deposited thereon. The first metal shield 250 and the second metal shield 252 may have similar configuration. In one embodiment, both the first metal shield 250 and the second metal shield 252 have an annular shape. The first metal shield 250 and the second metal shield 252 each includes a stack of metal plates 254a-254e that are mutually isolated from one another. FIG. 2C is an enlarged view of the metal shield 250 according to one embodiment. Each plate 254a-254e may be annular and have an inner edge 256 and an outer edge 258. The ends 256 of the plates 254a-254e are separated from one another by an insulating washer 260, so the plates 254a-254e are mutually isolated from one another. The washer 260 also separates the plate 254e from the first plate 203. The stack of metal plates 254a-254e may be secured by one or more ceramic rods (not shown). The one or more ceramic rods may go through the stack of metal plates 254a-254e and the washers, and one end of each rod is coupled to the inner wall 206 while the other end of each rod is coupled to the first/second plate 203, 205.

In one embodiment, the distance "D1" between the inner edge 256 and the outer edge 258 of the plate 254a is smaller than the distance "D2" between the inner edge 256 and the outer edge 258 of the plate 254b, which is smaller than the distance "D3" between the inner edge 256 and the outer edge 258 of the plate 254c, which is smaller than the distance "D4" between the inner edge 256 and the outer edge 258 of the plate 254d, which is smaller than the distance "D5" between the inner edge 256 and the outer edge 258 of the plate 254e. In other words, the distance between the inner edge 256 and the outer edge 258 is related to the location of the plate, i.e., the further the plate is disposed from the plasma region 124, the greater distance between the inner edge 256 and the outer edge 258. In this configuration, the electrical voltage between the inner wall 206 and the outer wall 204 is divided by six, since there are six gaps: between the inner wall 206 and the outer edge 258 of the plate 254a, between the outer edge 258 of the plate 254a and the outer edge 258 of the plate 254b, between the outer edge 258 of the plate 254b and the outer edge 258 of the plate 254c, between the outer edge 258 of the plate 254c and the outer edge 258 of the plate 254d, between the outer edge 258 of the plate 254d and the outer edge 258 of the plate 254e, and between the outer edge 258 of the plate 254e and the outer wall 204. Each gap has a small electric potential so the electric field across the gap is small, such the area cannot light up and take the applied power, thus forcing the power to go into the plasma region 124, creating a plasma in the plasma region 124. Without the shields 250, 252 as described above, there could be a localized plasma discharge between the first end 216 of the inner wall 206 and the first end 212 of the outer wall 204 and between the second end 218 of the inner wall 206 and the second end 214 of the outer wall 204, and the plasma region 124 may not be filled with plasma.

The spaces between the metal plates 254a-254e may be dark spaces, which may be bridged with materials deposited on the plates, causing the plates to be shorted out to each other. To prevent this from happening, in one embodiment, each metal plate 254a-254e includes a step 262 so the outer edge 258 of each metal plate 254a-254e is further away from the adjacent plate. The step 262 causes the outer edge 258 to be non-linear with the inner edge 256. Each step 262 shields the dark space 264 formed between adjacent metal plates, so no material may be deposited in the dark space 264.

The outer wall 204, the inner wall 206, and the shields 250, 252, 259 may be all made of metal since metal is resistant to most chemistries used in the semiconductor processes. The type of metal used may be depending on the chemistry used in the vacuum processing chamber upstream of the plasma source 100. In one embodiment, a chlorine based chemistry is used and the metal may be stainless steel, such as 316 stainless steel. The insulating rings 230, 232 in chlorine based chemistry may be made of quartz. In another embodiment, a fluorine based chemistry is used and the metal may be aluminum and the insulating rings 230, 232 may be made of alumina. The inner wall 206 may be made of anodized aluminum or spray coated aluminum.

While the foregoing is directed to embodiments of the present invention, other and further embodiments of the invention may be devised without departing from the basic scope thereof, and the scope thereof is determined by the claims that follow.

The invention claimed is:

1. A plasma source, comprising:
   a first plate having an outer edge and an inner edge;
   a second plate parallel to the first plate, wherein the second plate has an outer edge and an inner edge;
   an outer wall disposed between the outer edges of the first and second plates;
   an electrode disposed between the inner edges of the first and second plates;
   a first plurality of magnets disposed on the first plate; and
   a second plurality of magnets disposed on the second plate.

2. The plasma source of claim 1, wherein the first plate and the second plate are annular.

3. The plasma source of claim 1, wherein the outer wall has a first end and a second end, wherein the first end is in contact with the outer edge of the first plate and the second end is in contact with the outer edge of the second plate.

4. The plasma source of claim 3, wherein the electrode has a first end and a second end, wherein the first end is in proximity to the inner edge of the first plate and the second end is in proximity to the inner edge of the second plate.

5. The plasma source of claim 4, further comprising a first insulating ring disposed between the first end of the electrode and the inner edge of the first plate.

6. The plasma source of claim 5, further comprising a second insulating ring disposed between the second end of the electrode and the inner edge of the second plate.

7. The plasma source of claim 1, wherein the first plurality of magnets has an annular shape and the second plurality of magnets has an annular shape.

8. The plasma source of claim 7, wherein a plasma region is defined by the electrode, the outer wall, the first plate and the second plate.

9. The plasma source of claim 8, wherein a polarity of the first plurality of magnets facing the plasma region is opposite to a polarity of the second plurality of magnets facing the plasma region.

10. A plasma source, comprising:
    a cylindrical electrode having a first end and a second end;
    an outer cylindrical wall surrounding the cylindrical electrode, wherein the outer cylindrical wall has a first end and a second end;
    a first annular plate having an inner edge and an outer edge, wherein the inner edge is in proximity to the first end of the cylindrical electrode and the outer edge is adjacent to the first end of the outer cylindrical wall;
    a second annular plate having an inner edge and an outer edge, wherein the inner edge is in proximity to the second end of the cylindrical electrode and the outer edge is adjacent to the second end of the outer cylindrical wall, and wherein a plasma region is defined by the cylindrical electrode, the outer cylindrical wall, the first annular plate and the second annular plate;
    a first plurality of magnets disposed on the first annular plate; and
    a second plurality of magnets disposed on the second annular plate.

11. The plasma source of claim 10, wherein the first plurality of magnets has an annular shape and the second plurality of magnets has an annular shape.

12. The plasma source of claim 10, wherein a polarity of the first plurality of magnets facing the plasma region is opposite to a polarity of the second plurality of magnets facing the plasma region.

13. The plasma source of claim 10, wherein the cylindrical electrode is hollow and has a first surface facing the outer cylindrical wall and a second surface opposite the first surface.

14. The plasma source of claim 13, further comprising a cooling jacket in contact with the second surface of the cylindrical electrode.

15. A plasma source, comprising:
    a first annular plate having an outer edge and an inner edge;
    a second annular plate parallel to the first annular plate, wherein the second annular plate has an outer edge and an inner edge, and wherein the first annular plate has a surface facing the second annular plate and the second annular plate has a surface facing the first annular plate;
    an outer cylindrical wall disposed between the outer edges of the first and second annular plates;
    an cylindrical electrode disposed between the inner edges of the first and second annular plates;
    a first shield disposed adjacent to the surface of the first annular plate; and
    a second shield disposed adjacent to the surface of the second annular plate.

16. The plasma source of claim 15, further comprising a third shield disposed adjacent to the outer cylindrical wall.

17. The plasma source of claim 15, wherein the first shield and the second shield each comprises a stack of plates.

18. The plasma source of claim 17, wherein the plates are annular and each has an inner edge and an outer edge.

19. The plasma source of claim 18, wherein each plate has a different distance between the inner edge and the outer edge.

20. The plasma source of claim 17, wherein each plate has a step and the outer edge is non-linear to the inner edge.

* * * * *